US010215621B2

(12) United States Patent
Oshetski et al.

(10) Patent No.: US 10,215,621 B2
(45) Date of Patent: Feb. 26, 2019

(54) ENHANCED OPTICAL CONDITION MONITORING SYSTEM FOR POWER TRANSFORMER AND METHOD FOR OPERATING POWER TRANSFORMER

(71) Applicant: MICATU INC., Horseheads, NY (US)

(72) Inventors: Michael Oshetski, Horseheads, NY (US); Atul Pradhan, Pittsford, NY (US)

(73) Assignee: Micatu Inc., Horseheads, NY (US)

( * ) Notice: Subject to any disclaimer, the term of this patent is extended or adjusted under 35 U.S.C. 154(b) by 0 days.

(21) Appl. No.: 15/566,984

(22) PCT Filed: Apr. 15, 2016

(86) PCT No.: PCT/US2016/027782
§ 371 (c)(1),
(2) Date: Oct. 16, 2017

(87) PCT Pub. No.: WO2016/168621
PCT Pub. Date: Oct. 20, 2016

(65) Prior Publication Data
US 2018/0128673 A1   May 10, 2018

Related U.S. Application Data

(60) Provisional application No. 62/149,140, filed on Apr. 17, 2015.

(51) Int. Cl.
*G01H 9/00* (2006.01)
*G01R 31/02* (2006.01)
(Continued)

(52) U.S. Cl.
CPC ............ *G01H 9/004* (2013.01); *G01H 9/00* (2013.01); *G01R 31/027* (2013.01);
(Continued)

(58) Field of Classification Search
CPC .. G01H 9/00; G01R 31/027; H01F 2027/404; H02H 7/04
See application file for complete search history.

(56) References Cited

U.S. PATENT DOCUMENTS 3,567,325 A    3/1971  Tibbals, Jr.
3,742,222 A    6/1973  Endl
(Continued)

FOREIGN PATENT DOCUMENTS

CN    104283321 A    1/2015
CN    104345233 A    2/2015
(Continued)

OTHER PUBLICATIONS

PCT International Search Report and Written Opinion corresponding to PCT/US2016/027782, dated Jul. 12, 2016.
(Continued)

*Primary Examiner* — Maurice Smith
(74) *Attorney, Agent, or Firm* — LeClairRyan PLLC

(57) ABSTRACT

The present technology relates a transformer condition monitoring system including a light source configured to produce an emitted light beam. A plurality of optical sensors are configured to be positioned at a plurality of separate locations on a transformer, receive the light beam from the light source, and generate product light beams from the emitted light beam. A detector is positioned to receive the product light beams from the optical sensors and is configured to measure intensity values of the product light beams for each of the optical sensors. A computing device is coupled to the detector and includes a processor coupled to a memory. The processor executes programmed instructions stored in the memory to determine, based on the measured intensity values for the product light beams for the optical
(Continued)

sensors, at least a displacement value, a current value, and a voltage value for the transformer.

21 Claims, 5 Drawing Sheets

(51) Int. Cl.
    *H01F 27/40*     (2006.01)
    *H02H 7/04*     (2006.01)

(52) U.S. Cl.
    CPC ..... *H01F 27/402* (2013.01); *H01F 2027/404* (2013.01); *H02H 7/04* (2013.01)

(56) References Cited

U.S. PATENT DOCUMENTS

| | | | |
|---|---|---|---|
| 3,824,018 | A | 7/1974 | Crane, Jr. |
| 5,396,172 | A | 3/1995 | Lat et al. |
| 5,896,193 | A | 4/1999 | Colbourne et al. |
| 5,903,158 | A | 5/1999 | Eriksson et al. |
| 7,136,169 | B2 | 11/2006 | Sandstrom |
| 9,013,144 | B2* | 4/2015 | Cooley ............... H01G 11/58 320/112 |
| 9,599,532 | B2* | 3/2017 | Mateti ............... G01M 7/027 |
| 2009/0323737 | A1 | 12/2009 | Ensher et al. |
| 2011/0317235 | A1 | 11/2011 | Desai |
| 2012/0031581 | A1 | 2/2012 | Chillar et al. |
| 2012/0050735 | A1 | 3/2012 | Higgins et al. |
| 2012/0092114 | A1 | 4/2012 | Matthews |
| 2012/0315002 | A1 | 12/2012 | Wigley et al. |
| 2014/0118003 | A1 | 5/2014 | Chen et al. |
| 2016/0003782 | A1* | 1/2016 | Von Herzen ....... G01N 29/2418 73/655 |
| 2016/0216152 | A1* | 7/2016 | Jain .................. G01R 31/027 |

FOREIGN PATENT DOCUMENTS

| | | |
|---|---|---|
| DE | 102007013466 A1 | 10/2008 |
| DE | 102012109640 A1 | 4/2014 |
| EP | 1786083 A1 | 5/2007 |
| WO | 2012/031447 A1 | 3/2012 |
| WO | 2014014783 A1 | 1/2014 |
| WO | 2015178975 A2 | 11/2015 |

OTHER PUBLICATIONS

International Search Report and Written Opinion for corresponding PCT Application No. PCT/US2015/015763 (dated Nov. 13, 2015).
EP Search Report for EP Application No. 15795374.6, dated Sep. 26, 2017.
Zook et al., "Fiber-Optic Vibration Sensor Based on Frequency Modulation of Light-Excited Oscillators", Sensors and Actuators 83 (2000), pp. 270-276.
Oursler et al., "Full-Field Vibrometry Using a Fabry-Perot Etalon Interferometer" Applied Optics, vol. 31, No. 34, (1992), pp. 7301-7308.
Furstenau et al., "Fiber-Optic Extrinsic Fabry-Perot Interferometer Vibration Sensor with Two-Wavelength Passive Quadrature Readout", IEE Transactions on Instrumentation and Measurement, IEE Service Center, vol. 47, No. 1 (1998), pp. 143-147.
EP Search Report for EP Application No. 16780848.4, dated Nov. 29, 2018.

* cited by examiner

ENHANCED OPTICAL CONDITION MONITORING SYSTEM FOR POWER TRANSFORMER AND METHOD FOR OPERATING POWER TRANSFORMER

This application is a national stage application under 35 U.S.C. § 371 of PCT Application No. PCT/US2016/027782, filed Apr. 15, 2016, which claims the benefit of U.S. Provisional Patent Application Ser. No. 62/149,140, filed Apr. 17, 2015, which is hereby incorporated by reference in its entirety.

FIELD OF THE INVENTION

The subject matter described herein generally relates to power transformers and, more particularly, to a method and condition monitoring system for facilitating operation of power transformers.

BACKGROUND OF THE INVENTION

With the development and advancement of technology, power utilities need greater amounts of electricity thereby causing power distribution systems and networks to expand, and thus increasing the requirements for monitoring safety and reliability of the power distribution system. Power transformers, which convert voltage ranges in both step-down and step-up fashion, are key components and hardware of the power distribution system. As a core piece of equipment for the safe operation of the whole system, it is particularly important to ensure power transformers function within operational voltage and current ranges. In case of failure of the power transformers, widespread disruption of the power distribution system can occur, which seriously affects national and societal economic well being, day to day life, and living standards. Therefore, the capabilities of fault detection and condition monitoring of power transformers have an important economic and societal significance.

The traditional method of monitoring transformer status information for safety, reliability, and efficiency is visual inspection, chemical sampling, testing of oil in transformer windings, and high-voltage electrical testing. These conventional methods can only provide information for transformer fault and lag after a failure or a fault has occurred, and only after the accident measurement information has been obtained. The lack of real time condition monitoring information indicating faults in power transformers that could lead to failures is a major weakness of power distribution systems that can cause disruption of electrical power transmission. Faults and failures of the power transformers and resultant power distribution system would drive high costs of fees and penalties incurred by utility operators due to regulations and requirements of governmental oversight of the electrical utility power quality. However, by monitoring the vibrational state, in addition to the voltage and current of the transformer in real-time, a preventive role in detecting failures can be accurately achieved, including determination of the location of the fault.

The major impediment to achieving such real-time, in-situ monitoring of power transformers is the extremely large electromagnetic fields, capacitances, and inductances, associated with the internal structure of the transformer, particularly the windings. Such large electromagnetic fields preclude the placement of metal, conductor, or similar high dielectric constant sensor materials inside or within the vicinity of the transformer.

The present technology is directed to overcoming these and other deficiencies in the art.

SUMMARY OF THE INVENTION

One aspect of the present technology relates a transformer condition monitoring system. The transformer condition monitoring system includes a light source configured to produce an emitted light beam. A plurality of optical sensors are configured to be positioned at a plurality of separate locations on a transformer and to receive the emitted light beam from the light source. Each of the plurality of optical sensors is configured to generate one or more product light beams from the emitted light beam. The plurality of optical sensors includes at least one vibration sensor, at least one voltage sensor, and at least one current sensor. A detector is positioned to receive the one or more product light beams generated from each of the plurality of optical sensors, the detector configured to measure intensity values of the one or more product light beams for each of the plurality of optical sensors. A computing device is coupled to the detector. The computing device includes a processor and a memory coupled to the processor. The processor executes programmed instructions stored in the memory to determine, based on the measured intensity values for the one or more product light beams for each of the plurality of optical sensors, at least a displacement value, a current value, and a voltage value for the transformer.

Another aspect of the present technology relates to a method for monitoring a condition of a transformer using the transformer monitoring system. The transformer monitoring system is provided. The plurality of optical sensors are coupled to the transformer. The intensity values are measured for the one or more product light beams for each of the plurality of optical sensors over a period of time. based on the measured intensity values for the one or more product light beams for each of the plurality of optical sensors, At least a displacement value, a current value, and a voltage value are determined, based on the measured intensity values for the one or more product light beams for each of the plurality of optical sensors, for the transformer over the period of time. The determined displacement value, the determined current value, and the determined voltage value are monitored for changes over the period of time to monitor the condition of the transformer.

Yet another aspect of the present technology relates to a transformer including the transformer condition monitoring system. The plurality of optical sensors are positioned at a plurality of separate locations on the transformer.

In another aspect, a method for operating a power transformer is provided. The method includes generating at least one of a plurality of optical intensity signals, from which a plurality of vibrational values, a plurality of voltage values, and a plurality of current values are derived, deduced, or calculated. The method also includes determining voltage, current and power output of said power transformer. The method further includes changing the operational state of the power transformer as a function of the determined plurality of measurement values.

In another aspect, an optical power transformer condition monitoring system is provided. In this aspect, it is to be noted that vibration is a periodic motion of acceleration with an associated frequency spectrum. The system includes a plurality of optically determined vibration, voltage, and current measurement optical sensors. The system also includes at least one processor coupled to the plurality of sensors. The at least one processor is programmed to determine a difference between each of the plurality of sensors of at least one of vibration, and voltage, and current of the power transformer systems. An output of the at least one processor includes at least one of a power transformer vibration (as a function of frequency), voltage, and/or current measurement signal. The processor provides said measurements to an external central monitoring station or additional processing or processor for external monitoring of said power transformer.

Sensors based on optical methods and low dielectric constant or insulating materials are ideal for placement on or within power transformers. Such sensors can be embedded within or located in close proximity to electrical power transformers to advantageously enable on-line optical monitoring techniques for power transformer vibration condition monitoring. Using all-optical voltage and current sensors, for example, real-time continuous recording of the various effects related to transformer faults, lifetime degradation, and early discovery of latent failures of power transformers could be realized. Such all-optical based sensor and condition monitoring can therefore achieve basic operational state maintenance of power transformers as part of a power distribution network.

An all optical based sensor system for condition monitoring provides a number of advantages including greater reliability by using a completely passive measurement, i.e., no moving parts, metal, high-dielectric materials, or electronics at the points of measurement. Optical sensor systems also allow for operation in high Electric and Magnetic Fields (EMF), radiation, and temperature ranges. Additionally, optical sensor systems allow for a lower cost by removing all the cost of electronics from each sensor and using a multiplexed electronics for detection.

DETAILED DESCRIPTION OF THE INVENTION

Figure 1:
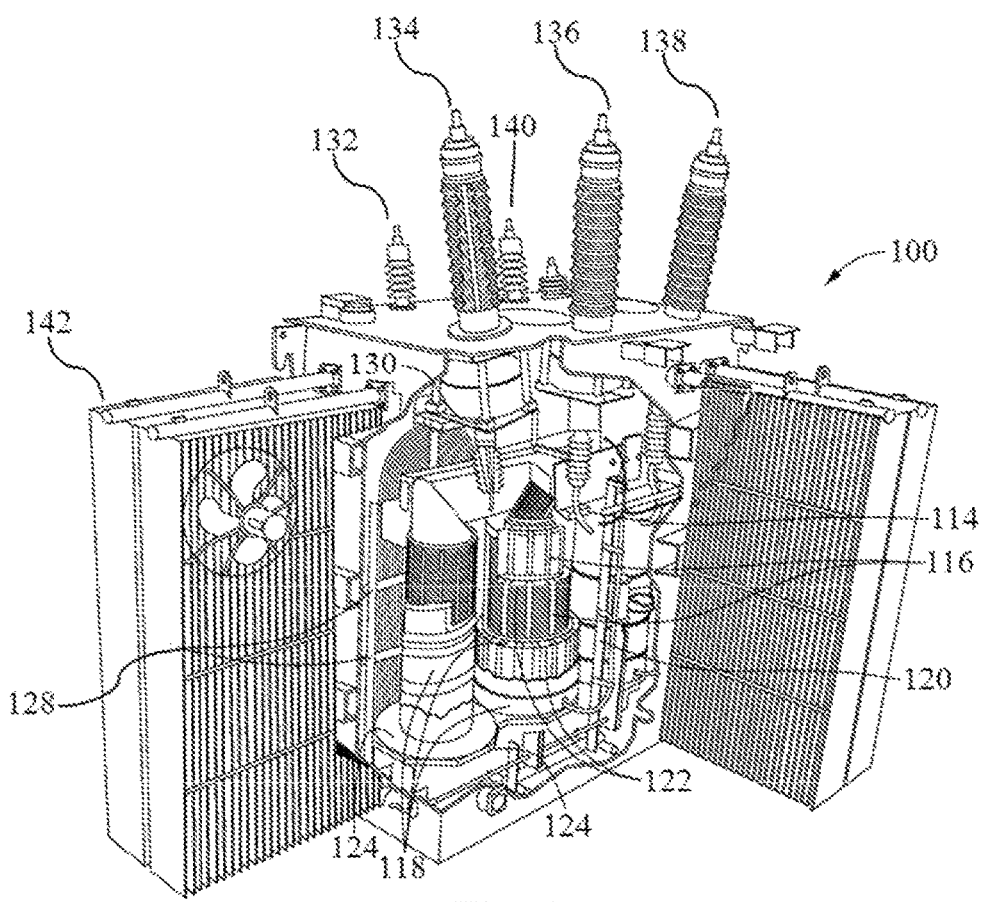
FIG. 1 is a perspective view of a cross-section of a high-voltage, fluid-filled power transformer.

The present invention relates to an optical sensor system and methods of use thereof. More specifically, the present invention relates to a transformer condition monitoring system, a method for monitoring a condition of a transformer using the transformer monitoring system, and a transformer including the transformer condition monitoring system.

One aspect of the present technology relates a transformer condition monitoring system. The transformer condition monitoring system includes a light source configured to produce an emitted light beam. A plurality of optical sensors are configured to be positioned at a plurality of separate locations on a transformer and to receive the emitted light beam from the light source. Each of the plurality of optical sensors is configured to generate one or more product light beams from the emitted light beam. The plurality of optical sensors includes at least one vibration sensor, at least one voltage sensor, and at least one current sensor. A detector is positioned to receive the one or more product light beams generated from each of the plurality of optical sensors, the detector configured to measure intensity values of the one or more product light beams for each of the plurality of optical sensors. A computing device is coupled to the detector. The computing device includes a processor and a memory coupled to the processor. The processor executes programmed instructions stored in the memory to determine, based on the measured intensity values for the one or more product light beams for each of the plurality of optical sensors, at least a displacement value, a current value, and a voltage value for the transformer.

The present inventions plurality of sensors that are all optical. Sensors included in the said optical condition monitoring system include: displacement and vibration, such as the etalon based sensors disclosed in PCT Applications PCT/US2015/15763 and PCT/WO2015178975, which is hereby incorporated herein by reference in its entirety. The sensors included in the optical condition monitoring system may also include optical voltage and current sensors, such as disclosed in U.S. Pat. Nos. 5,731,579, 5,892,357, 5,939,711, 6,124,706, 6,307,666, 6,362,615, 6,388,434, 6,621,258 and 6,492,800, and U.S. Patent Application Publication No. 2014/0300341, the disclosures of which are hereby incorporated herein by reference in their entirety. The present technology combines the said optical sensor technologies into a complete method of measuring vibration, a method of measuring voltage and a method of measuring current of an of power transformer using the system, and a method of monitoring the condition of a said power transformer.

Another aspect of the present invention relates to embedding the said system into the components of said power transformer. An optical sensor is permanently placed in-between the materials that comprises the components of the power transformers windings. An exemplary embodiment would place sensors placed between the layers of the transformer windings, power transformer exterior case, or embedded inside the power transformer. In another embodiment, sensors can be placed in the electrical bushings and insulators for the direct measurement of mechanical and electrical properties of said power transformer. A plurality of optical sensors and a plurality of measurement types can be embedded in the structure and systems of said power transformer which connect optically to the said light source and detector and processor.

According to another aspect of the present invention, the vibration power transformer on-line monitoring system is composed of an optical acceleration sensor, an optical voltage sensor, and an optical current sensor, information processing circuit, data communication module, power supply circuit, and printed circuit boards (PCBs). The optical sensors are mounted on the external enclosure of the transformer or at the core of the transformer windings to provide optical intensity signal acquisition with signal output terminal and the information processing circuit input terminal connected to the optical intensity sensor to provide information processing and routing through the communication module. The communication module sends data signals to be transmitted over a wireless or a wired network, with a processor transmitting to and receiving information.

The vibration, current, and voltage sensors of the aforementioned condition monitoring system are sensitive to and will react to electromotive forces within transformers. The current-carrying conductor generates substantial magnetic fields so that the transformers windings will vibrate due to electromotive and mechanical forces formed by the interaction of drain and flow currents in the corresponding magnetic flux density. The vibrations of the transformer windings will then be mainly transmitted through the insulating oil tank.

The core vibration is another major factor in the transformer body vibration, mainly for two reasons that affect the core vibration; one is that the core magnetostrictive vibration caused by winding materials; the other is seams between winding materials where electromagnetic attraction exists between the laminations generated due to the magnetic flux leakage, causing vibrations. The core of magnetostrictive vibration is transmitted to the tank via two paths, one is a solid pathway, core vibration transmitted to the tank through its feet; the other is a liquid pathway, core vibration transmitted through the insulating oil tank. Vibrational energy is thus transferred in these two ways, so that the tank wall (including magnetic shielding, etc.) vibrates.

The electromagnetic force within a transformer winding is directly proportional to the current. The current in the winding has a periodic sinusoidal dependence at twice the AC (alternating current) line frequency and induces a magnetostrictive force as:

$$F=bI^2=b\cos^2(\omega t)$$

where I is the current, b is a constant, and $\omega$ is twice the angular frequency of the line current. A change in AC current magnitude, voltage, or load, will proportionally change the magnitude of vibration at harmonics of the AC frequency. Direct Current (DC) injection currents can also induce vibrations at frequencies other than harmonics. Because of the magnetostriction effect in winding coils, the clamping pressure of the winding coils is proportional to the current, so that a change in current leading to a decrease or increase in clamping pressure, or looseness or tightness in the coil windings, leads to an offset with a proportional change in the frequency of the vibrations. The causal effects between current, magnetostrictive force, clamping pressure, and vibration amplitude and frequency or frequencies provides for direct correlative methods for condition monitoring of power transformers and the basis of methods and algorithms thereof.

Therefore, another aspect of the present invention uses a plurality of optical acceleration sensors, an optical acceleration sensor when acceleration motion, distance from the border on electrodes changes, and availability of mass displacement movement by detecting changes in capacitance. The displacement of the signal transmitted to the detector is positioned to receive the plurality of product light beams generated from the sensors and is configured to measure intensity values for the plurality of product light beams. The product light beams intensities are measured by the detector unit where they are then processed to determine values for the displacements and vibrations of said optical acceleration sensors. These values then allow the current state of operation of the said power transformer to be determined. Once this current state of operation of said transformer is known, it can then be compared to historical states of operation to determine future state of operation. This information can be transmitted to a central control center for further analysis or changes in the mode of operation of the said power transformer.

The vibration power transformer on-line monitoring system, by monitoring the vibrations of the transformer and tank provides data that reflects the status of the transformer, including the status of internal core and windings. This data can then provide the operating utility, using information processors and computers, and other such machines, the means to monitor and model the performance and operational readiness of transformers critical to the power distribution network. The present sensor monitoring technology, being all-optical, and applicable to the internal structure of transformers and their windings, is a novel, advanced development featuring safe installation of the sensors, and directly providing time series data and associated FFT frequency spectrograms and similar information on the status of the transformer. Such instantaneous data will show variations and transients that would be fault predictors. With such feedback, preventive maintenance and procedures can be instituted for power transformers to limit disruption and manage power loads on distribution networks.

FIG. 1 is a perspective view of a cross-section of a high-voltage, fluid-filled power transformer 100 according to an embodiment of the present invention. As illustrated in FIG. 1, the transformer 100 includes a variety of transformer components that may be monitored as part of the present invention. More specifically, the transformer 100 includes current transformer (CT), supports 130, support blocks 124, locking strips 116, winding cylinders 118, lead supports 128, radical spacers 122, high voltage inputs 134,136 138, low voltage outputs 132, 140, cooling fans 142, and end blocks 124.

In operation, a cooling fluid (e.g., an electrical or dielectric insulating fluid such as, for example, a naphthenic mineral oil, a paraffinic-based mineral oil including isoparaffins, synthetic esters and natural esters (e.g., FR3™) flows between the transformer components 130, 114, 116, 118, 128, 122, and 124 to cool the electrical systems during the operation of the said power transformer. For purposes of clarity, the cooling fluid is not illustrated in FIG. 1. The cooling fluid is selected not only to cool components within the transformer 100 during the operation thereof but also to physically withstand the conditions (e.g., temperature levels, voltage and current levels, etc.) found within the transformer 100 during the operation thereof. Further, the cooling fluid is selected to be chemically inert with respect to the transformer components and with respect to the insulation that is positioned between these components. The cooling fluid also transmits the acoustic and vibrational signals of the power transformer coils 116 to the case and structural supports 118, 124 during the operation.

Figure 2:
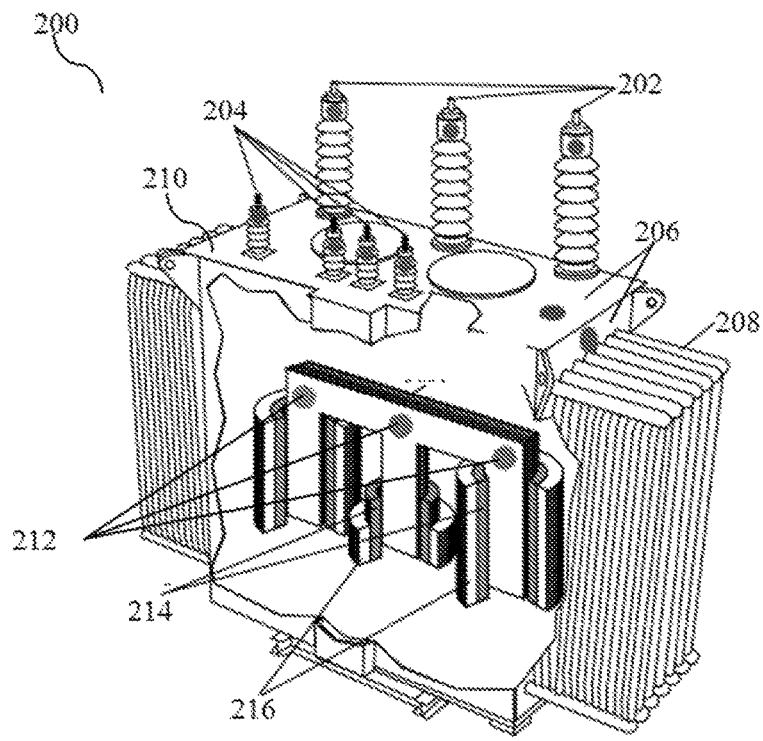
FIG. 2 is a perspective view of the cross-section of a high-voltage, fluid-filled power transformer of FIG. 1 including condition monitoring system sensors in accordance with the present technology.

FIG. 2 is a cross-sectional schematic 200 of an embodiment of locations of optical sensor placements of exemplary power transformer 100 (shown in FIG. 1) condition monitoring system. Various components of power transformer 100 include high voltage three phase connections voltage and current sensors 202 embedded inside the electrical insulation bushing. Likewise optical voltage and current sensors are placed inside the low voltage electrical insulation bushings, where voltage and current sensors 204 are located. Optical vibration sensors 212 are placed inside transformer 100 on the core and detect the magnetostrictive vibration of the windings 216 and insulation 214. The present invention also places optical vibration sensors on the case 210 of the power transformer at locations 206 to detect the vibrations of the external and internal structures of the transformer. Based on the current state operation determined by the condition monitoring system, the power transformer operators and or control systems can provide increased fan power (not pictured) to increase airflow over cooling fins 208.

Figure 3:
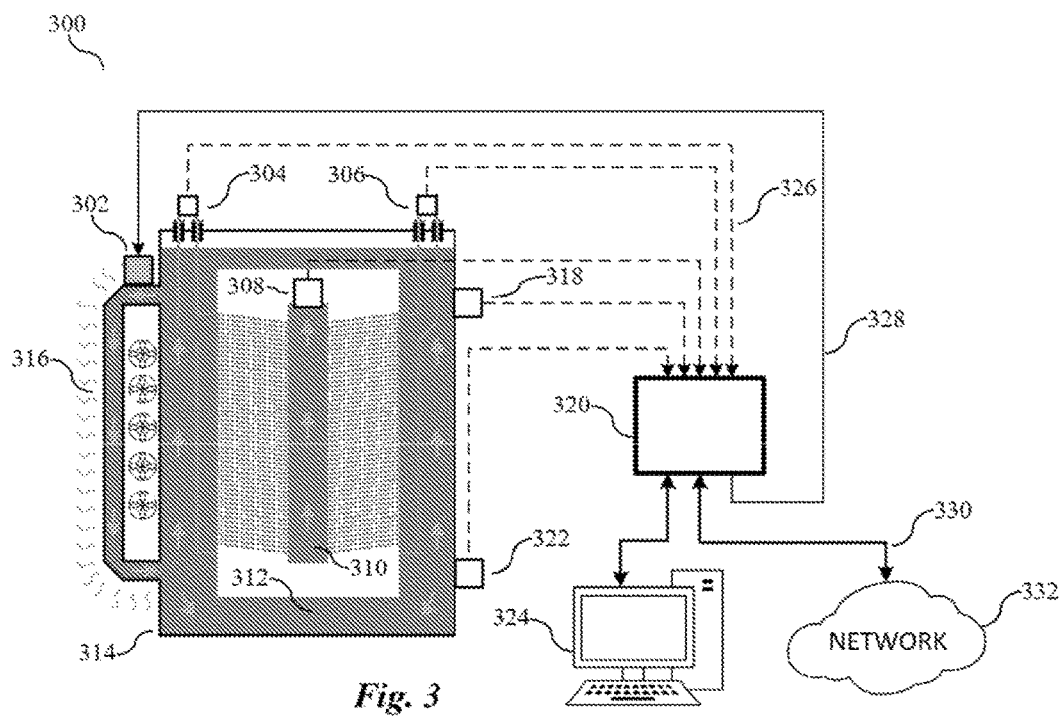
FIG. 3 is a schematic view of an exemplary condition monitoring system that may be used with the power transformer shown in FIG. 1.

FIG. 3 is a schematic view of an exemplary condition monitoring system 300 that may be used with power transformer 100 (shown in FIG. 1). In the exemplary embodiment, condition monitoring system 300 includes a plurality of sensors, i.e., a vibrational sensor, accelerometer, a voltage sensor and a current sensor. In the exemplary embodiment, sensors 318, 322 and 308 are vibrational and acceleration sensors, sensors 304 and 306 are current and voltage sensors.

All active components of the system, such as the light source, detector, and any additional electronics, are connected via optical cables 326 that house separate optical fibers (not shown) for connection of each of the sensors 304, 306, 308, 318 and 322 to a light source and one or more detectors. Each of the sensors 304, 306, 308, 318 and 322 are located separately to measure different systems of the power transformer. In this exemplary embodiment, the mechanical system, which include case 100 and core 114, and support frame members 124,118,128, and windings 116 and 114 and electrical systems, with high phase voltage inputs 202, and low phase output 204, are being monitored.

Each of the sensors 304, 306, 308, 318 and 322 may further be located remotely from the active electronics of the light source and detector, which are located within device 320. In one embodiment, one or more sensors of the present invention may be embedded in the structure of the power transformer core 114 or windings 120 to measure for vibration or monitored with the active components (i.e., light source, detector, and other electronics).

System 320 may detect vibration of an object, or monitor the condition of an object, e.g., determine changes in the standard frequency of the object to identify potential failure states, or a change in environmental conditions surrounding the object. System 320 may also detect voltage and current of an object, or monitor the condition of an object, e.g., determine changes in the voltage of the power transformer output or input based current state vs. historic state measurements.

In system 320 the computing device includes a processor and a memory coupled to the processor so that the processor executes programmed instructions stored in the memory to determine, based on the measured intensity values, a change in light intensity that is proportional to the said sensor measurement. Based on the optical intensity signals of each sensor, the system 320 sends a control signal to the power transformer system control 302 to increase cooling based on control signals or change the current operating state of the power transformer.

System 320 also connects to a local control station 324 or a network 332 via connection 330. Network 332 allows for external monitoring or control of the said power transformer to change its current operating state.

Figure 4:
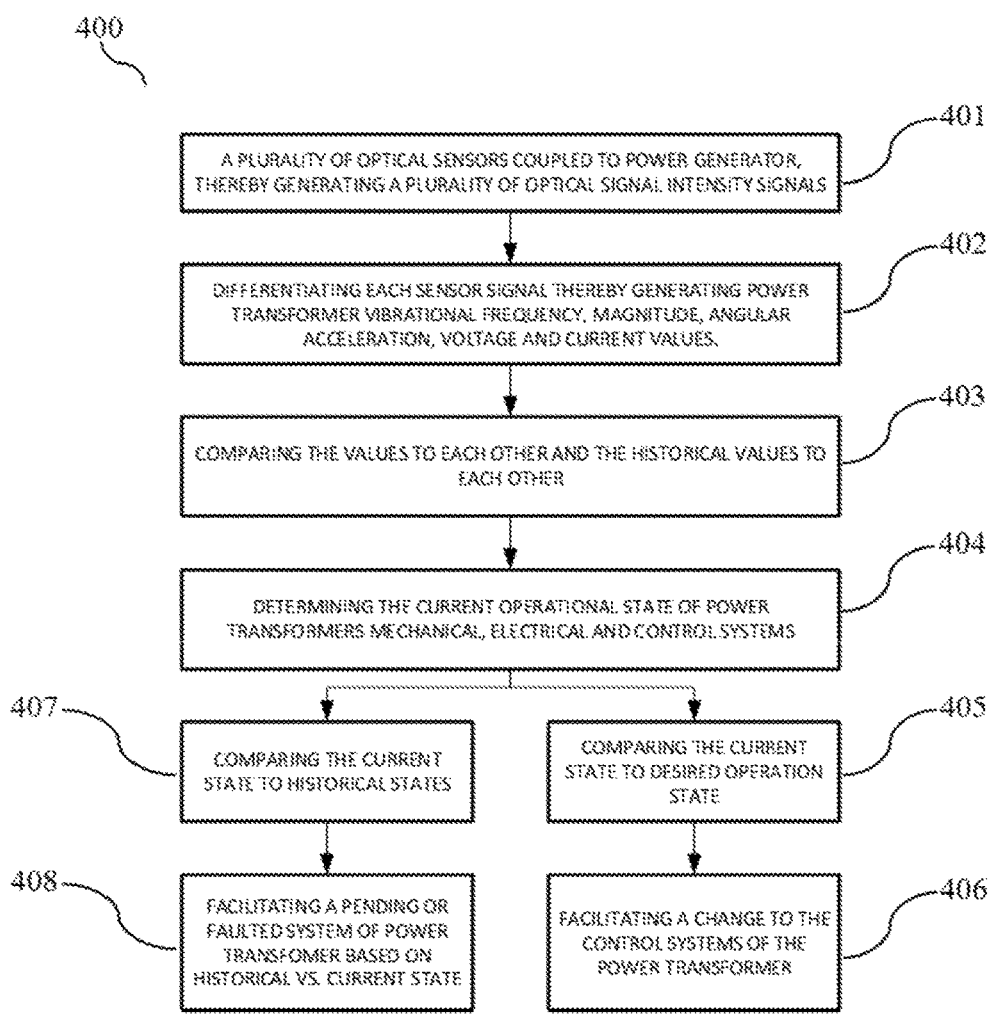
FIG. 4 is a flow chart of an exemplary method for monitoring a condition of a power transformer using the transformer monitoring system.

FIG. 4 is a flow chart of an exemplary method 400 of operating power transformer 100 (shown in FIG. 1). Method 400 includes 402 plurality of each sensors 304, 306, 308, 318 and 322 coupled to the mechanical system, which include case 100 and core 114, and support frame members 124,118,128, and windings 116 and 114 and electrical systems, high phase voltage input 134, 136 and 138, low phase output 132 and 140 thereby generating a plurality of optical intensity signals 401.

Method 400 also includes differentiating 402 each optical intensity signal, thereby generating a plurality of values, which may include, vibrational frequency, magnitude, angular acceleration, voltage and current values. Comparing the values 403 to the current value state vs. the historic value state allows for the prediction of future current states. Method 400 also allows for determining the current operational state of the power transformer.

Comparing the status allows for simultaneously determining 407 and 408 the operational changes of the power transformer system to facilitating a change to a desired state and then facilitating and identifying a pending faulted system of the power transformer.

Figure 5:
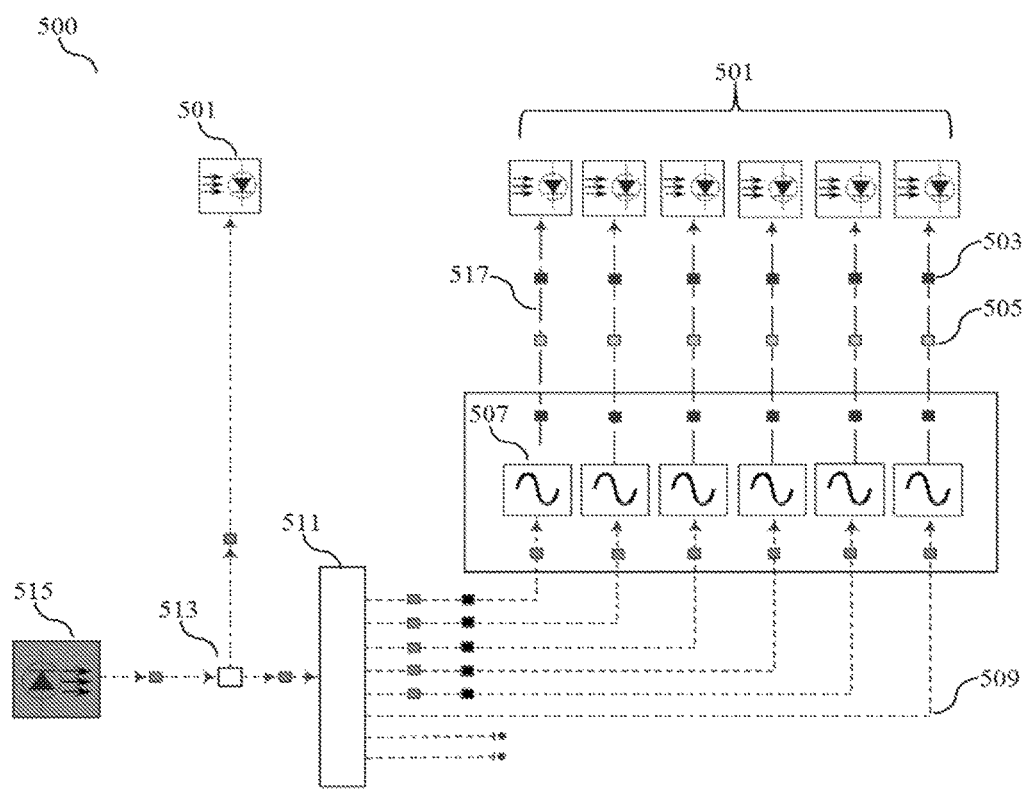
FIG. 5 is an optical schematic view of an exemplary condition monitoring system that may be used with the power transformer shown in FIG. 1.

FIG. 5 is an optical schematic view of an exemplary condition monitoring system 300 that may be used with power transformer 100 (shown in FIG. 1). In the exemplary embodiment, condition monitoring system 300 includes a plurality of sensors, i.e., a vibrational sensor and/or accelerometer, a voltage sensor and a current sensor. In the exemplary embodiment, sensors 507 can be a plurality of different types of vibrational, acceleration sensors, or current and voltage sensors.

Each of the plurality of sensors 507 is connected to an optical light source 515. This light source is tapped using an optical tap 513 to monitor the optical light output using photodiode 501. The light source 515 is split using optical splitter 511 into a plurality of light beams coupled to an optical fiber 509.

Each sensor 507 is connected optical light source fiber using optical connectors 503. This allows for sensors to be added and removed from the exemplary system 300 in the field. As the optical light passes though the plurality of optical sensors the output light is captured and transmitted using optical fiber 517 that is connected to a plurality of photodiode sensors 501. Each of the optical cables 517 and 509 use optical connectors or splices at location 503 to ensure a robust and low loss connection. The exemplary system may or may not use bend insensitive fiber for fiber cable 509 and 517 to maximize optical signal integrity while measuring a power transformer 100.

Figure 6:
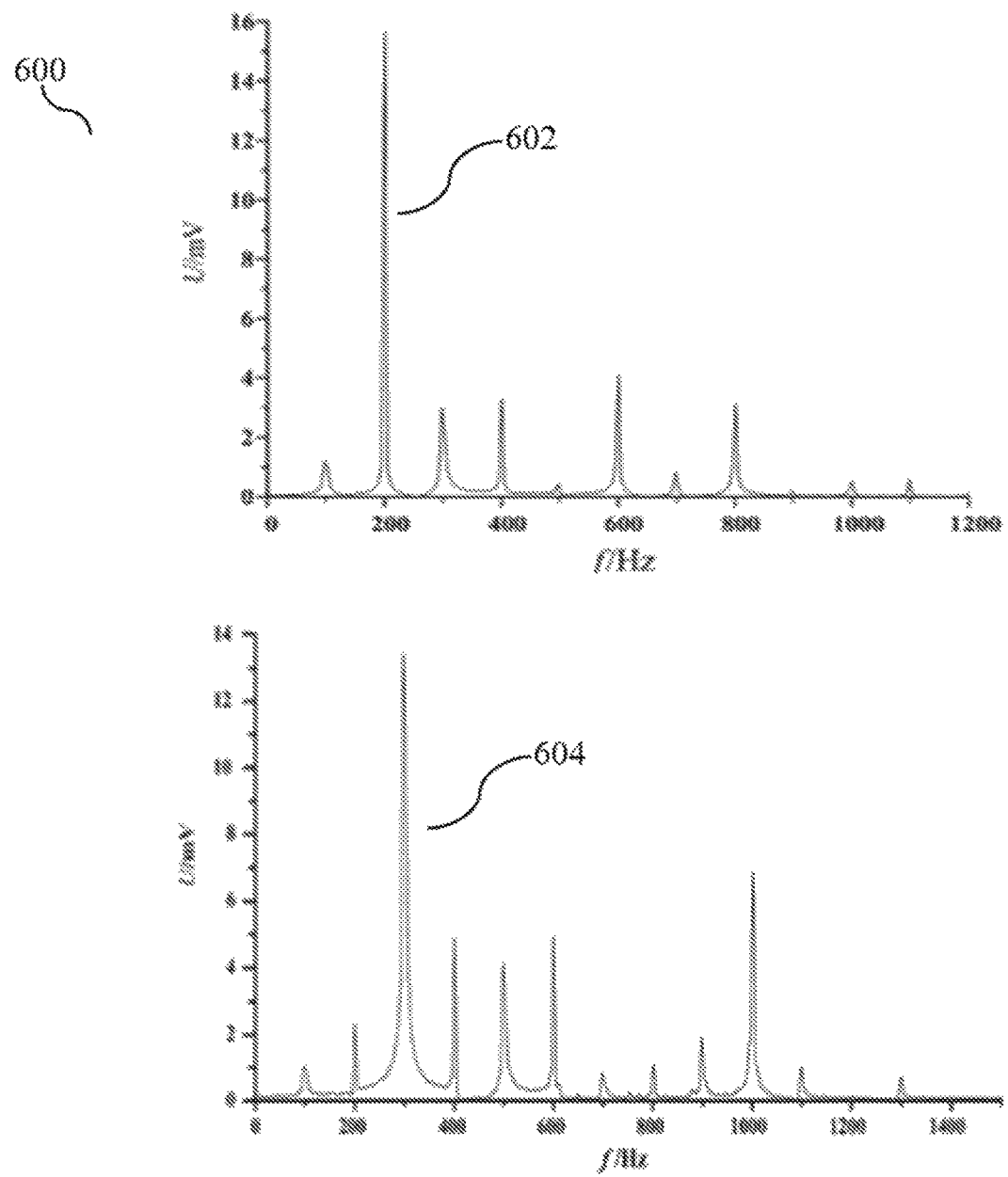
FIG. 6 is frequency pots measurements of an exemplary condition monitoring system as illustrated FIG. 3 that may be used with the power transformer shown in FIG. 1.

FIG. 6 shows frequency plots of measurements of an exemplary condition monitoring system in FIG. 3 that may be used with the power transformer shown in FIG. 1.

Shown is the measurement of different types of transformers, the vibration signals measured at the same surface positions present different characteristics. The main vibration frequency of the SSZ9-M-50MVA/110 kV transformer is of 200 Hz 602, however, SFZ-20MVA/110 kV transformer' is of 300 Hz 604. Furthermore, for the vibration amplitude of each frequency, the difference of two types is characteristic of each.

The nonlinearity of core magnetostriction leads to the existence of high order harmonics. The core has the primary natural vibration frequency of about 200 Hz or 300 Hz. With the excitation of core magnetostriction, resonance takes place. For different types of transformers, the cores are clamped with different pressure. Therefore, their primary natural vibration frequency is different, which leads to characteristic measurement results as shown.

However the individual power transformer natural vibration frequency is a direct function of the mechanical systems within the power transformer. Any changes in the frequency of said properties is directly correlated to the fundamental mechanical state (or configuration) of the transformer under condition monitoring. As the power transformer is damaged or undergoes mechanical failure during operation, the mechanical configuration of the core or windings changes resulting in a change of the magnitude and/or the natural vibrational frequency of the said power transformer.

The exemplary condition monitoring system 300 monitors the current state, i.e., natural vibration frequency and magnitude and compares this to the historical states, i.e. natural vibration frequency to analyze differences in the mechanical state and configuration of core and windings of the said power transformer.

The above-described method and condition monitoring system described herein facilitates operation of power transformer by measuring the current operational state of said power transformer. Such condition monitoring measurements provide indications of increased stresses on the power transformer systems that may be reduced by changes in the operational state of the power transformer, i.e. peak load, current and voltage, generator output, and operating temperature. Reducing such stresses facilitates extending the operational life expectancy of the power transformer.

Having thus described the basic concept of the invention, it will be rather apparent to those skilled in the art that the foregoing detailed disclosure is intended to be presented by way of example only, and is not limiting. Various alterations, improvements, and modifications will occur and are intended for those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A transformer condition monitoring system comprising:
    a light source configured to produce an emitted light beam;
    a plurality of optical sensors configured to be positioned at a plurality of separate locations on a transformer and to receive the emitted light beam from the light source, wherein each of the plurality of optical sensors is configured to generate one or more product light beams from the emitted light beam, the plurality of optical sensors comprising at least one vibration sensor, at least one voltage sensor, and at least one current sensor;
    a detector positioned to receive the one or more product light beams generated from each of the plurality of optical sensors, the detector configured to measure intensity values of the one or more product light beams for each of the plurality of optical sensors; and
    a computing device coupled to the detector, the computing device comprising a processor and a memory coupled to the processor, wherein the processor executes programmed instructions stored in the memory to determine, based on the measured intensity values for the one or more product light beams for each of the plurality of optical sensors, at least a displacement value, a current value, and a voltage value for the transformer.

2. The system of claim 1, wherein the displacement value comprises an angular displacement and the processor is further configured to execute at least one additional programmed instruction stored in the memory to determine an angular velocity value or an angular acceleration value for the transformer based on the determined displacement value over time.

3. The system of claim 1, wherein the processor is further configured to execute at least one additional programmed instruction stored in the memory to determine a vibrational frequency based on the displacement value over time.

4. The system of claim 1, wherein the processor is further configured to execute at least one additional programmed instruction stored in the memory to:
    compare each of the determined displacement value, the determined current value, and the determined voltage value for the transformer to a plurality of corresponding historical displacement values, current values, and voltage values for the transformer; and
    determine, based on the compared values, a potential failure state of the transformer.

5. The system of claim 1, wherein the processor is further configured to execute at least one additional programmed instruction stored in the memory to:
    compare each of the determined displacement value, the determined current value, and the determined voltage value for the transformer to corresponding standard operating displacement values, current values, and voltage values for the transformer;
    determine, based on the compared values, whether a difference between the determined values and the corresponding standard values exceeds a threshold value;
    identify a potential failure state of the transformer when the difference between the determined values and the corresponding standard values exceeds the threshold value; and
    provide an instruction to the transformer to change at least one control system operation status based on the identified potential failure state, wherein the at least one control operation comprises at least one of a peak load, a generator output, or an operating temperature.

6. The system of claim 1, wherein the at least one vibration sensor comprises an etalon positioned to receive the emitted light beam from the light source and configured to generate a plurality of product light beams from the emitted light beam, the etalon being mounted to a support structure at one or more pivot points, wherein the displacement value is determined based on a change in position of the etalon relative to the one or more pivot points, and wherein the processor is further configured to execute at least one additional programmed instruction stored in the memory to determine an acceleration value based on the determined change in position of the etalon relative to the one or more pivot points.

7. A method for monitoring a condition of a transformer, the method comprising:
    providing the transformer condition monitoring system of claim 1;
    coupling the plurality of optical sensors to the transformer;
    measuring a plurality of intensity values for the one or more product light beams for each of the plurality of optical sensors over a period of time;
    determining, based on the measured intensity values for the one or more
    product light beams for each of the plurality of optical sensors, at least a displacement value, a current value, and a voltage value for the transformer over the period of time;
    monitoring the determined displacement value, the determined current value, and the determined voltage value for changes over the period of time to monitor the condition of the transformer.

8. The method of claim 7, wherein the displacement value comprises an angular displacement, the method further comprising:

determining an angular velocity value or an angular acceleration value for the transformer based on the determined displacement value over time; and monitoring the determined angular velocity value or the determined angular acceleration value for changes over the period of time to monitor the condition of the transformer.

9. The method of claim 7 further comprising:

determining a vibrational frequency based on the displacement value over time;

monitoring the determined vibrational frequency value or the determined for changes over the period of time to monitor the condition of the transformer.

10. The method of claim 7, wherein the monitoring further comprises:

comparing each of the determined displacement value, the determined current value, and the determined voltage value for the transformer to a plurality of corresponding historical displacement values, current values, and voltage values for the transformer; and determining, based on the compared values, a potential failure state of the transformer.

11. The method of claim 7, wherein the monitoring further comprises:

comparing each of the determined displacement value, the determined current value, and the determined voltage value for the transformer to corresponding standard operating displacement values, current values, and voltage values for the transformer;

determining, based on the compared values, whether a difference between the determined values and the corresponding standard values exceeds a threshold value;

identifying a potential failure state of the transformer when the difference between the determined values and the corresponding standard values exceeds the threshold value; and changing at least one control system operation status of the transformer based on the identified potential failure state, wherein the at least one control operation status comprises at least one of a peak load, a generator output, or an operating temperature.

12. The method of claim 7, wherein the at least one vibration sensor comprises an etalon positioned to receive the emitted light beam from the light source and configured to generate a plurality of product light beams from the emitted light beam, the etalon being mounted to a support structure at one or more pivot points, wherein the displacement value is determined based on a change in position of the etalon relative to the one or more pivot points, the method further comprising determining an acceleration value based on the determined change in position of the etalon relative to the one or more pivot points.

13. The method as set forth in claim 7, wherein the at least one voltage sensor and at least one current sensor are coupled to one or more electrical insulation bushings of the transformer.

14. The method as set forth in claim 7, wherein the system comprises a plurality of vibrational sensors located at least at a core of the transformer, on a case of the transformer, on one or more support frame members of the transformer, or on one or more windings of the transformer.

15. A transformer comprising the transformer condition monitoring system of claim 1, wherein the plurality of optical sensors are positioned at a plurality of separate locations on the transformer.

16. The transformer of claim 15, wherein the displacement value comprises an angular displacement, wherein the processor is further configured to execute at least one additional programmed instruction stored in the memory to determine an angular velocity value or an angular acceleration value for the transformer based on the determined displacement value over time.

17. The transformer of claim 15, wherein the processor is further configured to execute at least one additional programmed instruction stored in the memory to determine a vibrational frequency based on the displacement value over time.

18. The transformer of claim 15, wherein the processor is further configured to execute at least one additional programmed instruction stored in the memory to:

compare each of the determined displacement value, the determined current value, and the determined voltage value for the transformer to a plurality of corresponding historical displacement values, current values, and voltage values for the transformer; and determine, based on the compared values, a potential failure state of the transformer.

19. The transformer of claim 15, wherein the processor is further configured to execute at least one additional programmed instruction stored in the memory to:

compare each of the determined displacement value, the determined current value, and the determined voltage value for the transformer to corresponding standard operating displacement values, current values, and voltage values for the transformer;

determine, based on the compared values, whether a difference between the determined values and the corresponding standard values exceeds a threshold value;

identify a potential failure state of the transformer when the difference between the determined values and the corresponding standard values exceeds the threshold value; and provide an instruction to the transformer to change at least one control system operation status based on the identified potential failure state, wherein the at least one control operation status comprises at least one of a peak load, a generator output, or an operating temperature.

20. The transformer of claim 15, wherein the at least one vibration sensor comprises an etalon positioned to receive the emitted light beam from the light source and configured to generate a plurality of product light beams from the emitted light beam, the etalon being mounted to a support structure at one or more pivot points, wherein the displacement value is determined based on a change in position of the etalon relative to the one or more pivot points, wherein the processor is further configured to execute at least one additional programmed instruction stored in the memory to determine an acceleration value based on the determined change in position of the etalon relative to the one or more pivot points.

21. The transformer of claim 15, wherein a plurality of vibrational sensors are located at least at a core of the transformer, on a case of the transformer, on one or more support frame members of the transformer, or on one or more windings of the transformer.

* * * * *